United States Patent
Choo et al.

(10) Patent No.: US 9,620,361 B2
(45) Date of Patent: Apr. 11, 2017

(54) APPARATUS FOR AND METHOD OF CRYSTALLIZING ACTIVE LAYER OF THIN FILM TRANSISTOR

(71) Applicant: SAMSUNG DISPLAY CO., LTD., Yongin, Gyeonggi-Do (KR)

(72) Inventors: Byoung-Kwon Choo, Yongin (KR); Sang-Hoon Ahn, Yongin (KR); Byoung-Ho Cheong, Yongin (KR); Joo-Woan Cho, Yongin (KR); Hyun-Jin Cho, Yongin (KR); Soo-Yeon Han, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/600,113

(22) Filed: Jan. 20, 2015

(65) Prior Publication Data

US 2015/0348782 A1    Dec. 3, 2015

(30) Foreign Application Priority Data

May 29, 2014 (KR) .................. 10-2014-0065337

(51) Int. Cl.
*H01L 21/02* (2006.01)
*H01L 27/146* (2006.01)

(52) U.S. Cl.
CPC .. *H01L 21/02683* (2013.01); *H01L 21/02532* (2013.01); *H01L 21/02686* (2013.01); *H01L 21/02691* (2013.01); *H01L 27/14698* (2013.01)

(58) Field of Classification Search
CPC ......... H01L 21/02683; H01L 21/02532; H01L 21/02685; H01L 21/02691
See application file for complete search history.

(56) References Cited

U.S. PATENT DOCUMENTS

| | | | |
|---|---|---|---|
| 2003/0003636 A1 | 1/2003 | Grigoropoulos et al. | |
| 2004/0241923 A1 | 12/2004 | Toida | |
| 2004/0259387 A1* | 12/2004 | Yamazaki ......... | B23K 26/0604 438/795 |

(Continued)

FOREIGN PATENT DOCUMENTS

| | | |
|---|---|---|
| JP | 2008-305866 A | 12/2008 |
| KR | 2002-0014704 A | 2/2002 |

(Continued)

OTHER PUBLICATIONS

Hiroyuki Kuriyam et al.; "Enlargement of Poly-Si Film Grain Size by Excimer Laser Annealing and It's Application to High-Performance Poly-Si Thin Film Transistor"; Japanese Journal of Applied Physics; vol. 30 No. 12B, Dec. 1991; pp. 3700-3703.

*Primary Examiner* — Julio J Maldonado
*Assistant Examiner* — Farun Lu
(74) *Attorney, Agent, or Firm* — Lee & Morse P.C.

(57) ABSTRACT

An apparatus for crystallizing an active layer of a thin film transistor, the apparatus includes a first laser irradiating a first beam toward a substrate, an amorphous layer on the substrate being crystallizable into the active layer of the thin film transistor by the first beam, and a second laser irradiating a second beam toward the substrate to heat the active layer, the second beam having an asymmetric intensity profile in a scanning direction of the first and second beams.

9 Claims, 4 Drawing Sheets

(56) References Cited

U.S. PATENT DOCUMENTS

| | | | | |
|---|---|---|---|---|
| 2008/0087895 A1* | 4/2008 | Han | ................... | B23K 26/0613 |
| | | | | 257/72 |
| 2012/0309140 A1* | 12/2012 | Oda | .................. | H01L 21/02532 |
| | | | | 438/158 |
| 2014/0004627 A1 | 1/2014 | Shen et al. | | |

FOREIGN PATENT DOCUMENTS

| | | | |
|---|---|---|---|
| KR | 10-2004-0072813 A | 8/2004 | |
| KR | 10-2005-0066258 A | 6/2005 | |

* cited by examiner

APPARATUS FOR AND METHOD OF CRYSTALLIZING ACTIVE LAYER OF THIN FILM TRANSISTOR

CROSS-REFERENCE TO RELATED APPLICATION

Korean Patent Application No. 10-2014-0065337, filed on May 29, 2014, in the Korean Intellectual Property Office, and entitled: "Apparatus for and Method of Crystallizing Active Layer of Thin Film Transistor," is incorporated by reference herein in its entirety.

BACKGROUND

1. Field

One or more embodiments relate to an apparatus for and method of crystallizing an active layer from an amorphous state to a crystalline state when manufacturing a thin film transistor.

2. Description of the Related Art

A flat panel display apparatus, e.g., an organic light emitting display apparatus or a liquid crystal display apparatus, includes a thin film transistor with an active layer. The active layer is formed on a substrate in an amorphous state and then is crystallized through an appropriate thermal treatment.

SUMMARY

According to one or more embodiments, an apparatus for crystallizing an active layer of a thin film transistor includes a first laser irradiating a first beam toward a substrate, an amorphous layer on the substrate being crystallizable into the active layer of the thin film transistor by the first beam, and a second laser irradiating a second beam toward the substrate to heat the active layer, the second beam having an asymmetric intensity profile in a scanning direction of the first and second beams.

The asymmetric profile of the second beam may have a greater width at a front side of the second beam, the front side contacting the substrate first, and may be gradually reduced toward a rear side of the second beam.

An irradiation region of the first beam may be less than an irradiation region of the second beam.

An irradiation time of the second beam may be longer than an irradiation time of the first beam.

The first laser may be an excimer laser, and the second laser may be one of an Ar laser and a $CO_2$ laser.

The second laser may be disposed to irradiate the second beam to at least one of a first surface of the substrate on which the active layer is formed and a second surface of the substrate which is opposite the first surface.

The substrate may be fixed and the first laser and the second laser may move in the scanning direction.

The first laser and the second laser may be fixed and the substrate may move in an opposite direction to the scanning direction.

The first beam may have a uniform intensity profile, and the second beam may have a gradually decreasing intensity profile relative to a front portion of the second beam.

According to one or more aspects of the embodiments, a method of crystallizing an active layer of a thin film transistor includes depositing an amorphous layer on a substrate, irradiating a first beam from a first laser toward the amorphous layer, while scanning the substrate, such that the amorphous layer is crystallized into the active layer of the thin film transistor, and irradiating a second beam from a second laser toward the substrate, while scanning the substrate, such that the crystallized active layer is heated, wherein the second beam has an asymmetric profile in a scanning direction.

The asymmetric profile of the second beam may have a greater width at a front side of the second beam which contacts the substrate first and may be gradually reduced toward a rear side of the second beam.

An irradiation region of the first beam may be less than an irradiation region of the second beam.

An irradiation time of the second beam may be longer than an irradiation time of the first beam.

The first beam may be an excimer laser beam, and the second beam may be one of an Ar laser and a $CO_2$ laser beam.

The second laser may be disposed to irradiate the second beam to at least one of a first surface of the substrate on which the active layer is formed and a second surface of the substrate which is opposite the first surface.

The substrate may be fixed and the first laser and the second laser may move in the scanning direction.

The first laser and the second laser may be fixed and the substrate may move in an opposite direction to the scanning direction.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
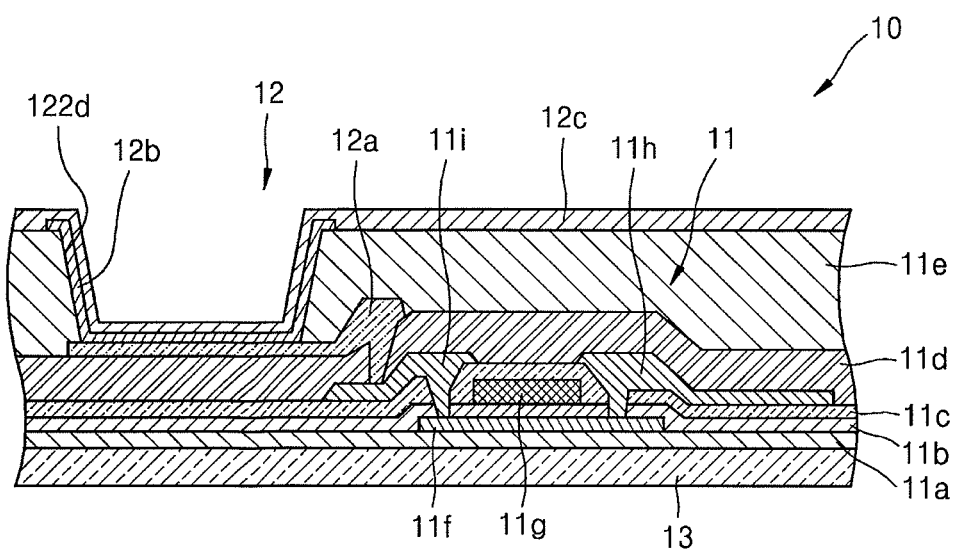
FIG. 1 illustrates a cross-sectional view of an organic light emitting display apparatus including a thin film transistor.

Example embodiments will now be described more fully hereinafter with reference to the accompanying drawings; however, they may be embodied in different forms and should not be construed as limited to those set forth herein. Rather, these embodiments are provided so that this disclosure will be thorough and complete, and will fully convey exemplary implementations to those skilled in the art.

As used herein, the singular forms "a," "an," and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

In the drawing figures, the dimensions of layers and regions may be exaggerated for clarity of illustration. In other words, since sizes and thicknesses of components in the drawings are illustrated for convenience of explanation, the following embodiments are not limited thereto. It will also be understood that when a layer or element is referred to as being "on" another layer or substrate, it can be directly on the other layer or substrate, or intervening layers may also be present. Like reference numerals refer to like elements throughout.

When a certain embodiment may be implemented differently, a specific process order may be performed differently from the described order. For example, two consecutively described processes may be performed substantially at the same time or performed in an order opposite to the described order. Expressions such as "at least one of," when preceding a list of elements, modify the entire list of elements and do not modify the individual elements of the list.

FIG. 1 is a cross-sectional view schematically showing a part of an organic light emitting display apparatus 10 including a thin film transistor.

Referring to FIG. 1, the organic light emitting display apparatus 10 may include a thin film transistor 11 and an electroluminescence (EL) device 12.

The EL device 12 may include a pixel electrode 12a and an opposite electrode 12c that face each other, and an organic emission layer 12b that is an emission operating layer disposed between the pixel electrode 12a and the opposite electrode 12c. The EL device 12 is driven by the thin film transistor 11 to emit light and to display images.

A constant voltage is continuously applied to the opposite electrode 12c, and a voltage is selectively applied by the thin film transistor 11 to the pixel electrode 12a connected to the thin film transistor 11. Therefore, when an appropriate voltage is generated between the pixel electrode 12a and the opposite electrode 12c by the selective voltage application from the thin film transistor 11, the organic emission layer 12b between the pixel electrode 12a and the opposite electrode 12c emits light and, thus, displays images.

In addition, the thin film transistor 11 has a structure in which an active layer 11f, a gate electrode 11g, a source electrode 11h, and a drain electrode 11i are stacked on a substrate 13. Therefore, when an electric signal is applied to the gate electrode 11g, the source electrode 11h and the drain electrode 11i are in an electrically conductable state via the active layer 11f. Accordingly, voltage is applied to the pixel electrode 12a connected to the drain electrode 11i, so that the organic emission layer 12b emits light.

A buffer layer 11a may be disposed between the substrate 13 and the active layer 11f. Reference numeral 11b denotes a gate insulating layer, reference numeral 11c denotes an interlayer insulating layer, reference numeral 11d denotes a passivation layer, and reference numeral 11e denotes a planarization layer.

A hole injection layer (HIL), a hole transport layer (HTL), an electron transport layer (ETL), and an electron injection layer (EIL) may be further stacked to be adjacent to the emission layer 12b of the EL device 12. In addition, the organic emission layer 12b may be formed in each pixel, so that pixels emitting red, green, and blue light are grouped as a unit pixel. Otherwise, the organic emission layer 12b may be commonly formed throughout the entire pixel area irrespective of locations of the pixels. The organic emission layer 12b may be formed by vertically stacking layers including light emitting materials emitting red, green, and blue light, or by mixing light emitting materials emitting the red, green, and blue light. Other materials emitting other light may be combined provided that white light may be emitted. In addition, a color conversion layer or a color filter for converting the white light into a predetermined color may be further provided. In addition, a thin film encapsulation layer (not shown), in which organic layers and inorganic layers may be alternately stacked, may be formed on the opposite electrode 12c.

When forming the active layer 11f, an amorphous layer, e.g., an amorphous silicon layer, is formed on the buffer layer 11a, e.g., the buffer layer may be between the substrate 13 and the amorphous layer. Then, the amorphous layer, e.g., the amorphous silicon layer, is crystallized through a thermal treatment to form a crystallized layer, e.g., an amorphous crystallized silicon layer. For example, the active layer 11f may be fabricated by performing a mask patterning on the crystallized silicon layer.

Figure 2A:
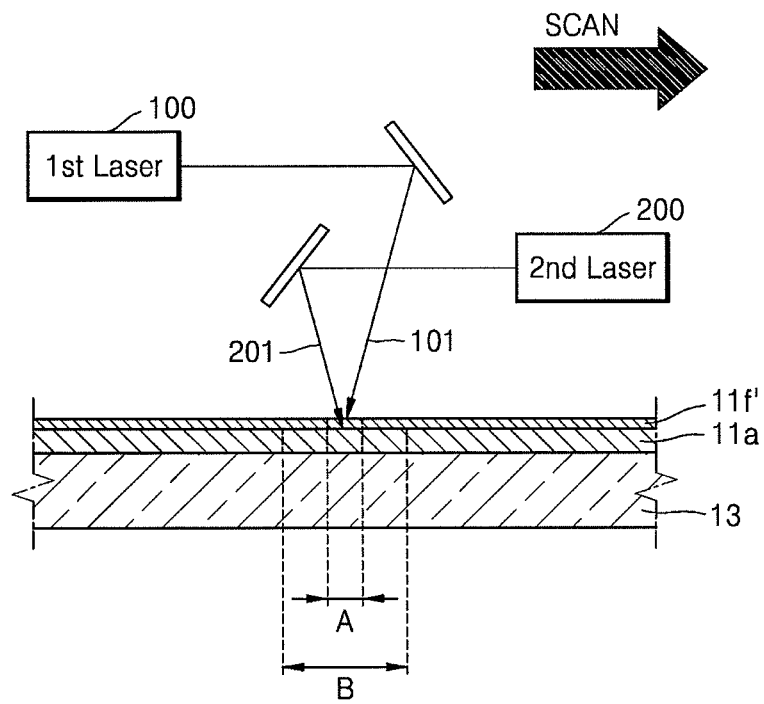
FIG. 2A illustrates a diagram of an apparatus for crystallizing an active layer of a thin film transistor according to an embodiment.
Figure 2B:
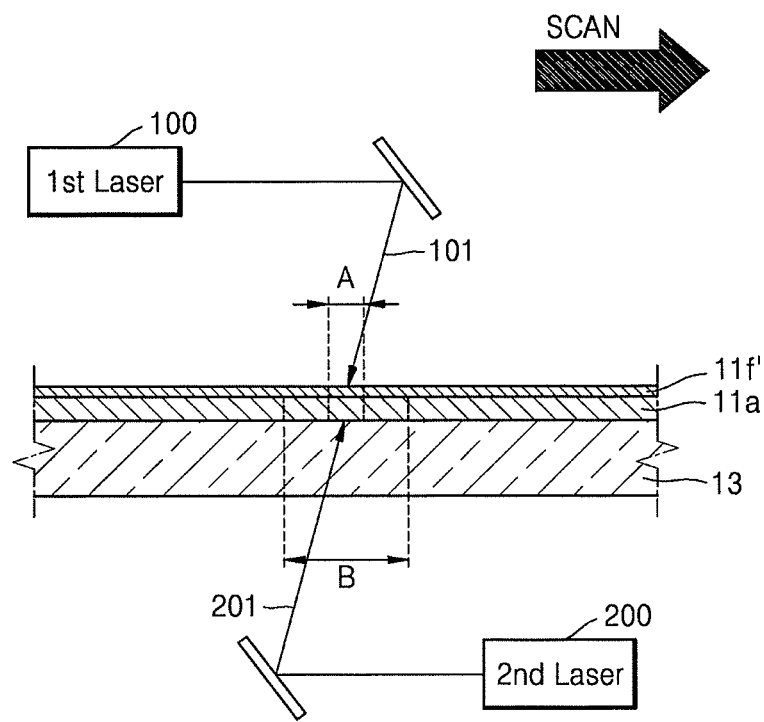
FIG. 2B illustrates a diagram of an apparatus for crystallizing an active layer of a thin film transistor according to another embodiment.

The crystallization apparatus for crystallizing the active layer 11f according to embodiments is used in the process of converting the active layer 11f from an amorphous state to a crystalline state, and has a structure shown in FIG. 2A and FIG. 2B. For clarity and convenience, FIGS. 2A-2B illustrate an amorphous active layer 11f' that is transformed into the active layer 11f of FIG. 1 after crystallization via the apparatus of the example embodiments.

Referring to FIG. 2A, a crystallization apparatus according to embodiments may include a first laser 100 and a second laser 200. The first laser 100 irradiates a first beam 101 toward the substrate 13 to, e.g., instantly, heat a corresponding irradiation region A of the amorphous active layer 11f' to a temperature that is equal to or greater than a crystallization temperature of the amorphous layer, e.g., a temperature of about 1,400° C. to about 1,500° C. A second laser 200 irradiates a second beam 201 toward the substrate 13 to maintain a corresponding irradiation region B of the amorphous active layer 11f', e.g., at about 300° C. to about 700° C. For example, as illustrated in FIG. 2A, the irradiation region B overlaps the entire irradiation region A and extends beyond the irradiation region A along a peripheral region surrounding the, e.g., entire, perimeter of the irradiation region A.

Figure 3A:
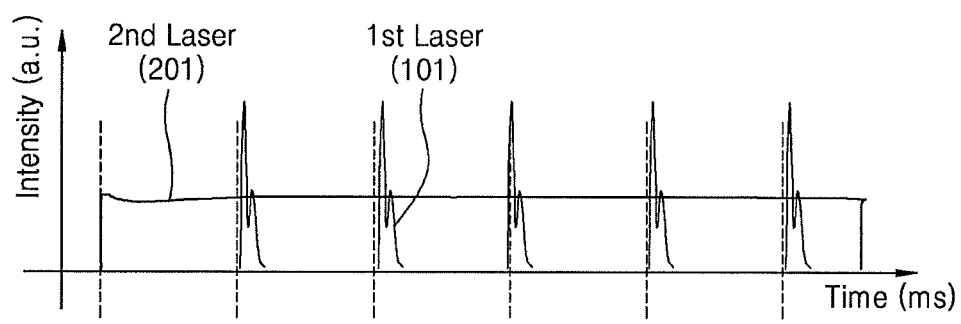
FIG. 3A illustrates a diagram showing timings for irradiating lasers in the apparatuses of FIGS. 2A and 2B.
Figure 3B:
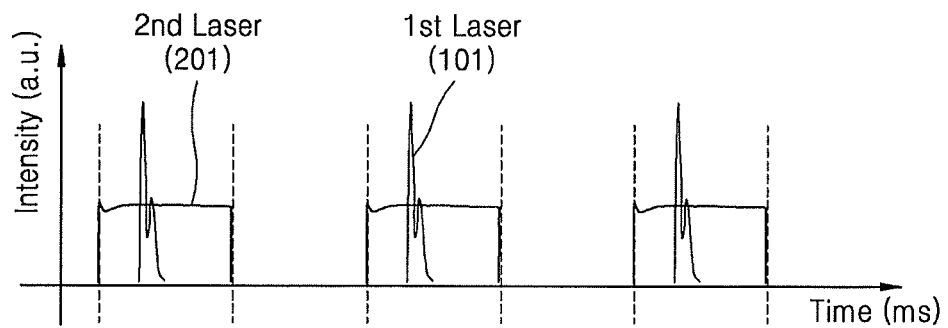
FIG. 3B illustrates a diagram showing other timings for irradiating lasers in the apparatuses of FIGS. 2A and 2B.

The first laser 100, e.g., an excimer laser, may be a crystallization laser that heats the amorphous layer, e.g., the amorphous silicon layer, to the crystallization temperature of the amorphous layer or higher, e.g., to crystallize the amorphous silicon layer. The second laser 200, e.g., an Ar laser or a $CO_2$ laser, is a heating laser for maintaining a peripheral portion of an irradiated portion of the crystallized active layer 11f at a temperature of about 300° C. to about 700° C., so as to restrain quench and induce crystallized particles to be as large as possible. For example, as illustrated in FIGS. 3A-3B, operation of the first and second lasers 100 and 200 partially overlaps.

That is, the actual crystallization is performed by irradiating the first beam 101 to the amorphous active layer 11f' from the first laser 100, so as to rise the temperature of the irradiated portion to a crystallization temperature or higher. Then, the second laser 200 maintains the temperature of the crystallized portion and its periphery at an appropriate high temperature as long as possible in order to increase sizes of the crystallized particles. When the crystallized particles become large, grain boundaries in the active layer 11f are reduced. Accordingly, resistance is reduced and electron mobility may be largely improved. That is, the electrical characteristics of the thin film transistor may be improved.

In addition, the irradiation region A of the first beam 101 is smaller than the irradiation region B of the second beam 201 for maintaining the heated state of the crystallization portion. As such, a speed of heat transfer from the crystallized portion may be reduced.

In detail, if the irradiation region A of the first beam 101 and the irradiation region B of the second beam 201 were to be equal to each other, i.e., completely overlap each other, an immediate periphery of the irradiation region A would not be heated directly. As such, a, e.g., direct, contact between the heated irradiation region A of the first beam 101, e.g., during a crystallization process, with the unheated immediate periphery of the irradiation region A would speed heat transfer away from the irradiation region A even if the second beam 201 heats the corresponding region, i.e., the region overlapping the irradiation region A. However, according to the present embodiment, when the irradiation region B of the second beam 201 is greater than the irradiation region A, a periphery of the irradiation region A of the first beam 101 may be also heated appropriately, thereby reducing the temperature difference and the cooling speed of the irradiation region A.

Since the first beam 101 of the first laser 100 heats the irradiation region A to a very high temperature, the substrate 13 may be deformed or other components of the thin film transistor 11 may be damaged if the first beam 101 is irradiated continuously for a long time. Therefore, the first beam 101 of the first laser 100 is irradiated intermittently in a pulse type manner, as shown in FIG. 3A or 3B. The second beam 201 of the second laser 200 maintains the temperature at an appropriate level that is lower than that of the first beam 101, and thus, the second beam 201 may be continuously irradiated as shown in FIG. 3A. In another example, the second beam 201 may be also intermittently irradiated as shown in FIG. 3B. In either case, the irradiation time of the second beam 201 may be longer than that of the first beam 101 because the cooling speed may be reduced to obtain large-sized crystallization particles, as described above with regard to the irradiation regions A and B.

For example, since the first beam 101 of the first laser 100 is a crystallizing laser, the first beam 101 is directly irradiated to the amorphous active layer 11*f*. However, since the second beam 201 of the second laser 200 is for maintaining a high temperature of the first irradiation region A and for heating the periphery of the first irradiation region A, i.e., of the crystallization region, the second beam 201 may be irradiated above the active layer 11*f*, as shown in FIG. 2A. In other words, the second beam 201 of the second laser 200 may be adjusted to not directly contact the active layer 11*f*.

In another example, the second laser 200 may be positioned below the substrate 13, so the second beam 201 is irradiated through the substrate 13 toward the active layer 11*f*, as shown in FIG. 2B. In this case, the active layer 11*f* is heated, and the buffer layer 11*a* is also heated to maintain the irradiation region B at the appropriate temperature for a long time.

In addition, in order to crystallize the entire amorphous active layer 11*f*, the first beam 101 and the second beam 201 scan the amorphous active layer 11*f*. For example, the first and second lasers 100 and 200 may move above the substrate 13 while scanning in a direction denoted by an arrow shown in FIG. 2A in a state where the substrate 13 is fixed. In another example, the first and second lasers 100 and 200 may move above and below the substrate 13, respectively, while scanning in the direction denoted by the arrow shown in FIG. 2B in a state where the substrate 13 is fixed. In yet another example, the substrate 13 may move in a direction opposite the arrow of FIG. 2A or 2B in a state where the first and second lasers 100 and 200 are fixed. In either case, the scanning direction of the first and second beams 101 and 201 is the arrow direction of FIG. 2A and FIG. 2B.

Figure 4A:
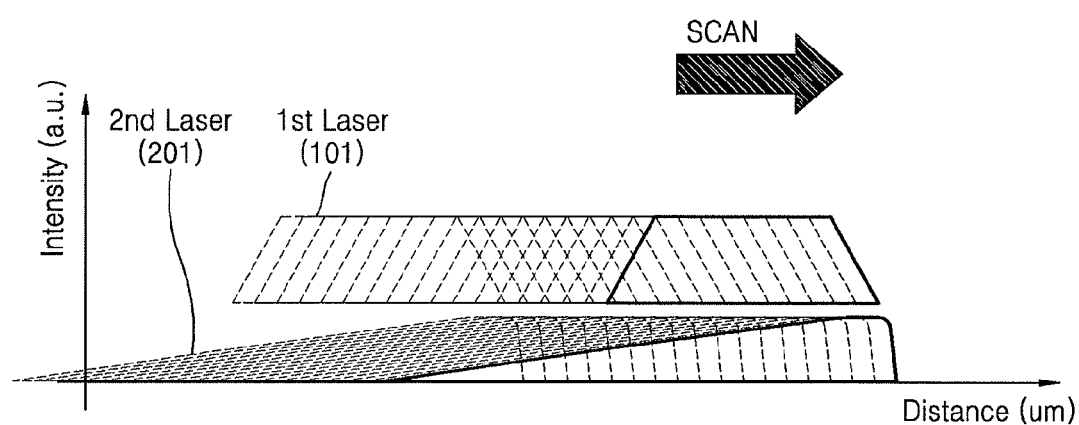
FIGS. 4A and 4B illustrate cross-sectional views of laser beam profiles in the apparatuses of FIGS. 2A and 2B.
Figure 4B:
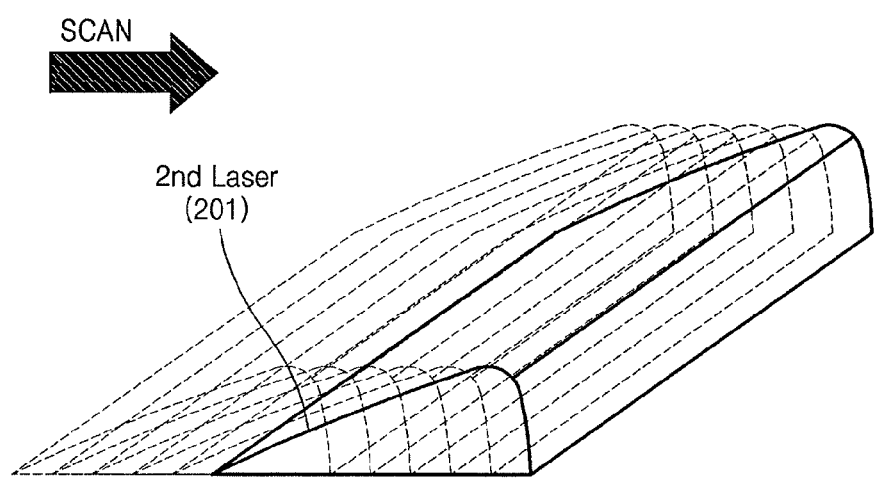

FIGS. 4A and 4B show profiles of the first beam 101 and the second beam 201, respectively, in the scanning direction. It is noted that the solid lines in FIGS. 4A-4B illustrate the shape of the intensity profile, while the dashed lines illustrate the movement of the shaped-profile along the scan direction. It is also noted that FIG. 4A illustrates the intensity profile relative to scanning distance, while the point of origin of the graph indicates the beginning of scanning. Further, FIG. 4B illustrates a three-dimensional shape of the intensity profile of the second beam 201.

The first beam 101 of the first laser 100 for crystallizing the amorphous active layer 11*f* has a general intensity profile, i.e., an evenly symmetric intensity profile, as shown in FIG. 4A. In other words, the irradiation intensity of the first beam 101 of the first laser 100 is substantially constant across the entire beam incident on the amorphous active layer 11*f*, i.e., regardless of a relative position of a point within an overlap area between the first beam 101 and the amorphous active layer 11*f* during scanning.

However, the second beam 201 of the second laser 200 for maintaining the appropriate temperature level has an asymmetric intensity profile that becomes greater toward a front side in the scanning direction, as shown in FIGS. 4A and 4B. In other words, the irradiation intensity of the front portion of the second beam 201 is larger than that of the rear portion. That is, the asymmetric profile of the second beam has a greater intensity at the front portion of the second beam 201 than at a rear portion of the second beam 201, i.e., the front portion of the second beam 201 contacts the substrate before the rear portion of the second beam 201 during scanning. Further, the intensity of the second beam 201 gradually decreases from the front portion toward the rear portion. This asymmetry may be realized, e.g., by using a spatial light modulator.

In detail, the asymmetric profile of the second beam 201 allows the second beam 201 to constantly, i.e., uniformly, heat the entire irradiation region B. That is, when the second beam 201 moves in the scanning direction, the front portion of the second beam 201 heats a region of the substrate 13 that is in a non-heated state, while the rear portion of the second beam 201 heats a region that has already been heated by the front portion of the second beam 201. Accordingly, the lower irradiation intensity of the rear portion of the second beam 201, i.e., which heats an already heated part of the region, decreases a temperature variation between the regions.

That is, if the second beam 201 were to have a constant, i.e., an evenly symmetrical, profile like the first beam 101, a region irradiated by the front portion of the second beam 201 would have a relatively lower temperature than a region irradiated by the rear portion of the second beam 201, i.e., a temperature variation would occur between the regions, as the rear portion of the second beam 201 would heat an already heated portion. However, when the temperature varies between the regions, growth speeds of the crystallized particles are different, and thus, it is difficult to form particles of uniform sizes.

In contrast, as shown in FIGS. 4A and 4B, if the second beam 201 is configured to have an asymmetrical profile in which the front side of the scanning direction is thick and the rear side of the scanning direction is thin, according to example embodiments, temperature variation between the regions may be prevented or substantially minimized. Thus, the entire region irradiated by the second beam 201 may have a substantially uniform temperature. Therefore, the crystallized particles in the resultant active layer 11*f* may be uniform and large, and accordingly, the electrical characteristics of the thin film transistor may be greatly improved.

Crystallization processes of the active layer 11f by using the crystallization apparatus having the above structure may be performed as follows.

First, the amorphous active layer 11f is formed of amorphous silicon on the buffer layer 11a. Then, the amorphous silicon is crystallized by scanning the first beam 101 of the first laser 100 and the second beam 201 of the second laser 200 onto the amorphous active layer 11f. In this case, the second beam 201 may be irradiated in the same direction as the first beam 101 as shown in FIG. 2A, or may be irradiated in an opposite direction relatively to the first beam 101 as shown in FIG. 2B. The first beam 101 heats the corresponding region of the active layer 11f to a temperature of about 1400° C. to about 1500° C. that is equal to or higher than a crystallization temperature, and the second beam 201 maintains the temperature of the corresponding region at a temperature level of about 300° C. to about 700° C. to increase the sizes of the crystallized particles as much as possible.

Also, as the profile of the second beam 201 has an asymmetric structure in which a front side in the scanning direction is thicker than a rear side in the scanning direction, as shown in FIGS. 4A and 4B. Accordingly, the irradiated region may be maintained at a uniform temperature.

After scanning the first and second beams 101 and 201 of the first and second lasers 100 and 200, the active layer 11f having large and uniform particles may be obtained. Then, the active layer 11f is patterned by using a mask to form a pattern as shown in FIG. 1.

By way of summation and review, one or more embodiments include an apparatus for and method of crystallizing an active layer of a thin film transistor. That is, the apparatus for and method of crystallizing an active layer in a thin film transistor according to embodiments, the sizes of the particles in the active layer may be efficiently increased. Thus, the resistance of the active layer may be reduced and the electrical characteristics of the thin film transistor may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of crystallizing an active layer of a thin film transistor, the method comprising:

depositing an amorphous layer on a substrate;

irradiating a first beam from a first laser toward the amorphous layer, while scanning the substrate, such that the amorphous layer is crystallized into the active layer of the thin film transistor; and irradiating a second beam from a second laser toward the substrate, while scanning the substrate, such that the crystallized active layer is heated, wherein the first beam heats the amorphous layer to a sufficiently high crystallization temperature without using the second beam, wherein the second beam has an asymmetric intensity profile in a scanning direction, and wherein the asymmetric intensity profile of the second beam is continuously and gradually reduced as an irradiation time of the second beam increases.

2. The method as claimed in claim 1, wherein an irradiation region of the first beam is smaller than an irradiation region of the second beam.

3. The method as claimed in claim 1, wherein an irradiation time of the second beam is longer than an irradiation time of the first beam.

4. The method as claimed in claim 1, wherein the first beam is an excimer laser beam, and the second beam is one of an Ar laser and a $CO_2$ laser beam.

5. The method as claimed in claim 1, wherein the first laser is on a first side of the substrate, and the second laser is on the first side of the substrate or on a second side of the substrate, the first and second side of the substrate being opposite each other.

6. The method as claimed in claim 1, wherein the substrate is fixed, and the first laser and the second laser move in the scanning direction.

7. The method as claimed in claim 1, wherein the first laser and the second laser are fixed, and the substrate moves in an opposite direction to the scanning direction.

8. The method as claimed in claim 1, wherein the first beam has a symmetric and substantially constant intensity profile in a scanning direction.

9. A method of crystallizing an active layer of a thin film transistor, the method comprising:

depositing an amorphous layer on a substrate;

irradiating a first beam from a first laser toward the amorphous layer, while scanning the substrate, such that the amorphous layer is crystallized into the active layer of the thin film transistor; and irradiating a second beam from a second laser toward the substrate, while scanning the substrate, such that the crystallized active layer is heated, wherein the second beam has an asymmetric intensity profile in a scanning direction, and wherein the first beam directly contacts the amorphous layer, and the second beam does not contact directly the amorphous layer.

* * * * *